United States Patent [19]
Kawabata et al.

[11] Patent Number: 4,939,069
[45] Date of Patent: Jul. 3, 1990

[54] PHOTOPOLYMERIZABLE COMPOSITION

[75] Inventors: Masami Kawabata, Takatsuki; Masahiko Harada, Suita; Yasuyuki Takimoto, Takatsuki, all of Japan

[73] Assignee: Nippon Paint Co., Ltd., Osaka, Japan

[21] Appl. No.: 269,711

[22] Filed: Nov. 10, 1988

[30] Foreign Application Priority Data

Nov. 10, 1987 [JP] Japan ................. 62-285017

[51] Int. Cl.$^5$ .............................. G03C 1/68
[52] U.S. Cl. .......................... 430/281; 430/915; 430/916; 430/920; 430/922; 430/925; 430/926; 522/24; 522/25; 522/26
[58] Field of Search .............. 430/915, 916, 920, 922, 430/925, 926, 281; 522/24, 25, 26

[56] References Cited

U.S. PATENT DOCUMENTS

| | | | |
|---|---|---|---|
| 4,391,686 | 7/1983 | Miller et al. | 204/159.15 |
| 4,766,055 | 8/1988 | Kawabata et al. | 430/281 |
| 4,868,092 | 9/1989 | Kawabata et al. | 430/915 |

FOREIGN PATENT DOCUMENTS 211615 7/1986 European Pat. Off. .............. 522/26

Primary Examiner—Paul R. Michl
Assistant Examiner—Christopher D. RoDee
Attorney, Agent, or Firm—Wenderoth, Lind & Ponack

[57] ABSTRACT

Disclosed is a photopolymerizable composition which is very sensitive to light, especially visible light having a wave length of 600 to 700 nm. The photopolymerizable composition comprising a polymerizable compound having an ethylenically unsaturated double bond and a photopolymerization initiator wherein the photopolymerization initiator comprises (a) a specific sensitizer and (b) a radical forming agent.

4 Claims, No Drawings

PHOTOPOLYMERIZABLE COMPOSITION

FIELD OF THE INVENTION

The present invention relates to a photopolymerizable composition which is sensitively cured by exposing to light sources emitting visible light or ultraviolet light.

BACKGROUND OF THE INVENTION

For an image formation by way of a photographic technique, there has been employed a photosensitive composition containing a photosensitive component such as diazonium salts, azides or quinonediazides, or a photohardening composition containing a photocrosslinkable component. Most of these compositions are sensitive to ultraviolet light, but not sensitive to visible light.

Scanning exposure techniques employing laser beams, however, have recently progressed so that it is desired to develop a photopolymerizable composition which is sensitive to visible light such as an argon laser. A composition containing a thioxanthene dyestuff which is sensitive to light of up to 600 nm is proposed and intensely studied.

In the field of laser beams, a semiconductor laser has become more popular instead of a gas laser(e.g. argon laser or helium-neon laser), because the semiconductor laser is cheap and does not need a complicated apparatus in comparison with the gas laser. Also, it is intensely studied that the wave length of a laser beam from the semiconductor laser is shifted to a visible light region from a near infrared region and in the near future the use of 600 to 700 nm will be possible. As a material sensitive to visible light of 600 to 700 nm, silver salt photography and electrophotography are exemplified. They, however, have defects in coating workability and resolving power. It is desirable to develop a material without having the above defects, that is, a photopolymerizable composition which is sensitive to visible light having a long wave length.

SUMMARY OF THE INVENTION

The present invention provides a photopolymerizable composition which is sensitive to light having a wide wave length including ultraviolet or visible light. The composition comprises a polymerizable compound having an ethylenically unsaturated double bond and a photopolymerization initiator wherein the photopolymerization initiator comprises;

(a) a sensitizer represented by the following formula:

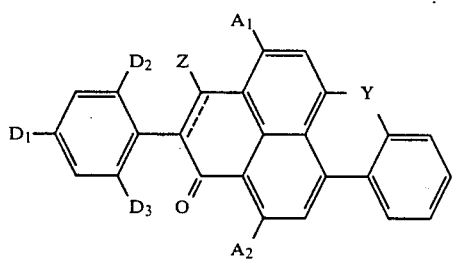

wherein Y represents an oxygen atom or sulfur atom, Z represents an oxygen atom, an alkoxy group having 1 to 3 carbon atoms or an alkanoyloxy group having 2 to 4 carbon atoms, provided that when Z is an oxygen atom the bond between said oxygen atom and the carbon atom adjacent thereto is a double bond and the dotted line in the formula (I) is removed, $A_1$ and $A_2$, which are the same or different, are a hydrogen atom or an electron attractive group, $D_1$, $D_2$ and $D_3$, which are the same or different, are a hydrogen atom and an electron donative group, provided that it is excluded where all $A_1$, $A_2$, $D_1$, $D_2$ and $D_3$ are hydrogen atoms; and (b) a radical forming agent.

In the formula (I), a compound in which all of $A_1$, $A_2$, $D_1$, $D_2$ and $D_3$ are hydrogen atoms is known as a sensitizer for a visible light-recording photosensitive resin (see Summary of Annual Meeting of Japan Photograph Society, to Kenichi KOZEKI, Shogo MIYAGUCHI, Tsutomu SHIROSAKI, Tsuguo YAMAOKA, May, 1984). The sensitivity of this compound which relates to the ability to initiate polymerization is varied by Z in the formula (I). According to the present invention, a spectrally sensitive range of the sensitizer can be extended to the longer wave-length region by way of introducing a substituent into $A_1$, $A_2$, $D_1$, $D_2$ and $D_3$.

DETAILED DESCRIPTION OF THE INVENTION

The electron attractive group to be introduced into $A_1$ and $A_2$ includes a nitro group, a cyano group, an acetyl group, a carboxyl group, a halogen (e.g. iodine, chlorine or bromine), —CHO, and —COOR$^2$ wherein R$^2$ represents a $C_1$-$C_4$ alkyl group. The electron donative group of $D_1$ to $D_3$ includes an amino group, a dimethylamino group, diethylamino group, a hydroxyl group, —OR$^3$ wherein R$^3$ represents a $C_1$-$C_3$ alkyl group, —OCOR$^4$ wherein R$^4$ represents a $C_1$-$C_3$ alkyl group and a $C_1$-$C_3$ alkyl group. In the compound (I), preferred are

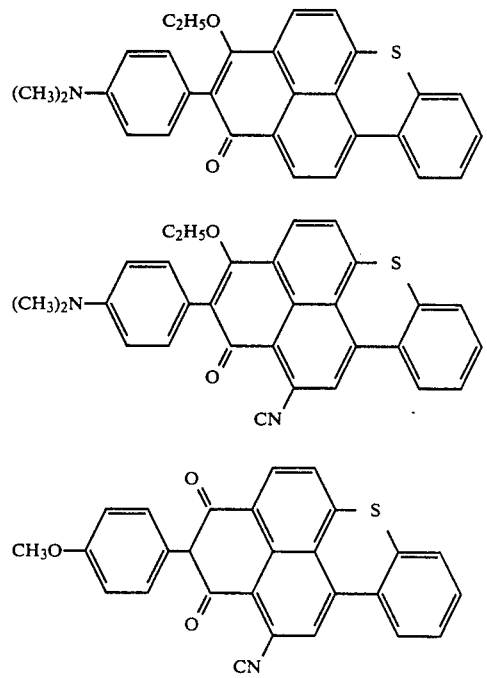

The above sensitizer can act by itself as a photopolymerization initiator, but in the present invention it is combined with one or more of the radical forming agent (b) to enhance sensitivity. The radical forming agent (b)

can be a diaryliodonium salt, a peroxyester, an organic halogen compound or a compound represented by

wherein R¹ represents a phenyl group or a substituted phenyl group and X represents oxygen, sulfur or -NH-. In the compound (II), the substituent can be an alkyl group, such as methyl, ethyl, propyl and the like; an amino group; a halogen, such as chlorine, bromine, iodine and the like; a dialkylamino group; a nitro group; or an alkoxy group. Examples of the compounds (II) are phenoxy acetate, o-chlorophenoxy acetate, thiophenoxy acetate, o-chlorothiophenoxy acetate, N-phenylglycine, N-(pmethoxyphenyl)glycine and the like. The diaryliodonium salt is generally represented by the formula (III);

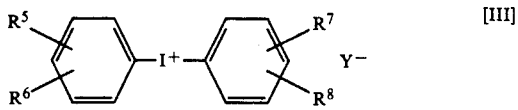

wherein $R^5$, $R^6$, $R^7$ and $R^8$, which are the same or different, are a hydrogen atom, a halogen atom (e.g. chlorine and bromine), a lower alkyl group having 1 to 4 carbon atoms (such as methyl, ethyl, propyl and t-butyl), a lower alkoxy having 1 to 3 carbon atoms (such as methoxy, ethoxy and propoxy) and a nitro group, Y- represents a halogen ion (such as $Cl^-$, $Br^-$ and $I^-$), a hydroxyl ion, $HSO_4^-$, $BF_4^-$, $PF_6^-$, $AsF_6^-$ or $SbF_6^-$. The diaryliodonium salt having the formula (III) can be prepared by a method as described in J. Polym. Sci. Polym. Symp. 56, p383-395 (1976). Examples of the diaryliodonium salts are chloride, bromide, tetrafluoroborate, hexafluorophosphate, hexafluoroarcenate and hexafluoroantimonate of iodonium, such as diphenyliodonium, bis(p-chlorophenyl)iodonium, ditolyliodonium, bis(p-t-butylphenyl)iodonium and bis(m-nitrophenyl)iodonium. Examples of the peroxyesters are t-butylperoxybenzoate, d-t-butyldiperoxyisophthalate, 2,5-dimethyl-2,5-di(benzoylperoxy)hexane, t-butylperoxymaleate, 3,3',4,4'-tetra(t-butylperoxycarbonyl)benzophenone, t-butylperoxyisopropyl carbonate and the like. The organic halogen compound includes carbon tetrabromide, iodoform, 1,1,1-tribromo-2-methyl-2-propanol, 2-trichloromethylbenzothiazolylsulfone, 2,4,6-tris(tichloromethyl)-1,3,5-triazine and the like. Preferred combinations are the compound (II) and the diaryliodonium salt, and the compound (II) and the peroxyester for high sensitivity to light.

The photopolymerization initiator composed of the sensitizer and the radical forming agent is combined with the polymerizable compound having an ethylenically unsaturated double bond to form the photopolymerizable composition of the present invention. The polymerizable compound of the present invention is usually a monomer or polymer having an ethylenically unsaturated bond, by which an addition polymerization occurs to cause curing. Typical examples of the polymerizable compounds are an unsaturated carboxylic acid (e.g. acrylic acid, methacrylic acid, itaconic acid, maleic acid etc.), an ester of the unsaturated carboxylic acid listed above and a polyhydroxy compound (e.g. ethylene glycol, tetraethylene glycol, neopentyl glycol, propylene glycol, 1,2-butane dione, trimethylolpropane, pentaerythritol, tripentaerythritol, etc.), an addition product of the unsaturated carboxylic acid listed above and an epoxide (e.g. trimethylolpropane polyglycidyl ether, pentaerythritol polyglycidyl ether, propyleneglycol diglycidyl ether, a reaction product of epichlorohydrine and 2,2-bis(4-hydroxyphenyl)propane, a glycidyl ester of phthalic acid, etc.), and a (meth)acrylamide (e.g. (meth)acrylamide, ethylenebis(meth)acrylamide, hexamethylenebis(meth)acrylamide, etc.). Preferred are an acryl ester and a methacryl ester.

The polymerizable composition of the present invention generally contains 0.01 to 0.2 parts by weight, preferably 0.02 to 0.1 parts by weight of the sensitizer, 0.005 to 0.2 parts by weight, preferably 0.01 to 0.08 parts by weight of the radical forming agent, based on one part by weight of the polymerizable compound having an ethylenically unsaturated double bond. Amounts less than the lower limit of each component do not impart the required photosensitivity to the composition. It, therefore, takes a long time for curing. Amounts more than the upper limit of each component deteriorate storage stability and cause a decline of film hardness, solvent-resistance and the like.

The photopolymerizable composition of the present invention may contain polymeric binders, heat-polymerization inhibitors, plasticizers and coloring agents, if desired. The polymeric binders are those improving compatibility, film-foming ability, developing capability, and adhesive properties. Typical examples of the polymeric binders are an acrylic acid copolymer; a methacrylic acid copolymer; an itaconic acid copolymer; a partially esterified maleic acid copolymer; a modified acidic cellulose having a branched carboxyl group; a polyethylene oxide; a polyvinylpyrolidone; a polyether of epichlorohydrine and 2,2-bis(4-hydroxyphenyl)propane; a polyamide; an alkyl poly(meth)acrylate such as poly(methyl (meth)acrylate); a copolymer of an alkyl acrylate with acrylonitrile, acrylic acid, methacrylic acid, vinyl chloride, vinylidene chloride, styrene and the like; a copolymer of acrylonitrile with vinyl chloride, or vinylidene chloride; a copolymer of vinyl acetate with vinylidene chloride, a chlorinated polyolefin, or vinyl chloride; polyvinyl acetate; a styrene-acrylonitrile copolymer; ABS, polyvinyl alkyl ether, a polyvinyl alkyl ketone, polystyrene, polyamide, polyurethane, polyethylene telephthalate, polyethylene isophthalate, acetylcellulose, polyvinyl butyral and the like. The binder may be present in the composition in an amount of not more than 10 parts by weight, preferably 0.5 to 3 parts by weight based on one part by weight of the polymerizable compound. The heat polymerization inhibitor includes hydroquinone, p-methoxyphenol, pyrogallol, catechol, 2,6-di-t-butyl-p-cresol, β-naphthol and the like. These inhibitors are present in an amount of 0.01 to 3 parts by weight based on the total amount of the polymerizable compound and the polymeric binder. The coloring agents include pigments such as phthalocyanine pigments, azo pigments, carbon black, titanium oxides, and the like; and dyes such as triphenylmethane dyes, azo dyes, and anthraquinone dyes. These coloring agents are present in an amount of 0.001 to 10% by weight of the total amount of the polymerizable compound and the polymeric binder. The plasticizer which may be contained in the photopolymerizable composition of the present invention includes dioctyl phthalate, didodecyl phthalate, dibutylphthalate, butylbenzyl phthalate, triethyleneglycol dicaprylate, dimethylglycol phthalate, tricresyl phosphate, dioctyl adipate, dibutyl adipate, dibutyl sebacate, dibutyl maleate, triacetylglycerol and the like. The amount of the plasticizer is up to 5% by weight based on the total amount of the polymerizable compound and the polymeric binder.

The photopolymerizable composition can be prepared by a known method. For example, the above mentioned ingredients are mixed neat or in a solvent at a high speed in a cool and dark place. Suitable solvents are ketones, such as methyl ethyl ketone, acetone and cyclohexanone; esters, such as ethyl acetate, butyl acetate, amyl acetate and ethyl propionate; aromatic hydrocarbons, such as toluene, xylene, benzene, monochlorobenzene; ethylene glycol monoalkyl ether, such as ethylene glycol monomethyl ether, ethylene glycol monoethyl ether and ethylene glycol monobutyl ether; alcohols, such as methanol, ethanol and propanol; ethers, such as tetrahydrofuran and dioxane; a halogen solvent, such as dichloromethane and chloroform; and the like.

In order to form a photosensitive resin layer on a substrate from the photopolymerizable composition mentioned above, the composition can be applied on the substrate by a bar coater or a spinner and then dried. The photosensitive resin layer is optionally subjected to a known treatment in order to prevent decline of sensitivity and storage stability due to oxgen. For example, the resin layer may be covered by a removable transparent sheet or provided with a coating of wax having low permeability of oxygen or of a water-soluble or alkaline water-soluble polymer.

The photosensitive resin layer can be exposed to curing with a conventional light source containing ultraviolet or visible light, such as an argon laser, a heliunneon laser, a helium-cadmium laser, a cripton laser, a semiconductor laser, a high pressure mercury lamp, a xenone lamp, a metal halide lamp, a fluorescent lamp and a tungsten lamp. Development after curing may be carried out by dissolving an uncured portion with a developing solution which can be selected depending on a kind of the photosensitive resin layer.

The composition of the present invention is very sensitive to visible light of 600 to 700 nm. Since the composition is very sensitive to visible light, a scanning exposure apparatus employing a laser light source of 600 to 700 nm can be employed to write directly on a lithographic printing plate, a resist of a printed circuit, and a master plate of hologram, without using a negative film. Since the composition of the present invention is also sensitive to visible light having a wave length of less than 600 nm and ultraviolet light, many light sources can be used so that the composition becomes more useful.

EXAMPLES

The present invention is illustrated by the following examples, but they are not construed as limiting the present invention.

Synthesis Example

A suspension was prepared by mixing 48.6 g of 4-nitronaphthalene dicarboxylic anhydride in 1,000 ml of dimethylformamide, to which 38.0 g of 2-aminobenzenethiol was added dropwise at room temperature over 30 minutes. After the completion of addition, 30 ml of amyl nitrite was added with stirring over 30 minutes and mixed for another 45 minutes. After cooling to room temperature, it was recrystallized with dimethylformamide to obtain a crystal of benzothioxanthene-3,4-dicarboxylic anhydride. The obtained crystal was reacted with p-dimethylaminophenylacetic acid and potassium acetate to obtain a reaction product. Then, 45.2 g of the reaction product was dissolved in 200 ml of dimethylformamide and 8.4 g of anhydrous potassium carbonate was added, followed by heating to reflux for 30 minutes. Produced water was removed and the resultant mixture was cooled to 60° C. before 25.2 g of diethyl sulfate was added for 2 hours and mixed at 60° C. for 2 hours. After cooling, methanol was added to the reaction solution and the precipitated solid was filtered and dried to obtain a sensitizer (a-1) shown in Table 1.

Sensitizers (a-2 and a-3) were prepared as generally described in Table 1 from the reactants shown Table 1.

TABLE 1

| Sensitizer | Chemical structure of (I) | Main reactant | |
|---|---|---|---|
| | | 4-nitronaphthalene dicarboxylic anhydride or a derivative thereof | Phenylacetate derivative |
| a-1 | $D_1 = N(CH_3)_2$<br>$D_2, D_3 = H$<br>$A_1, A_2 = H$<br>$Z = OC_2H_5$<br>$Y = S$ | 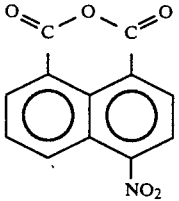 | 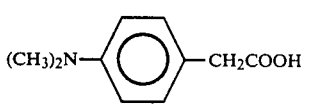 |
| a-2 | $D_1 = N(CH_3)_2$<br>$D_2, D_3 = H$<br>$A_1 = H$<br>$A_2 = CN$<br>$Z = OC_2H_5$<br>$Y = S$ | 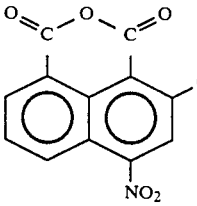 | 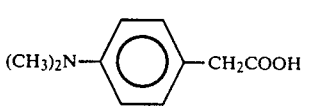 |

TABLE 1-continued

| Sensitizer | Chemical structure of (I) | Main reactant 4-nitronaphthalene dicarboxylic anhydride or a derivative thereof | Phenylacetate derivative |
|---|---|---|---|
| a-3 | $D_1$ = OCH$_3$<br>$D_2$, $D_3$ = H<br>$A_1$ = H<br>$A_2$ = CN<br>Z = O<br>Y = S | 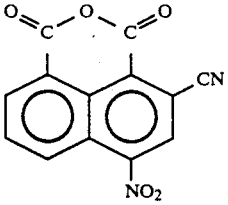 | 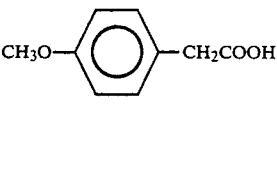 |

EXAMPLES 1 to 8 AND COMPARATIVE EXAMPLES 1 to 4

PREPARATION OF PHOTOPOLYMERIZABLE COMPOSITION

One hundred parts of the copolymer having a weight average molecular weight of 70,000 of methyl methacrylate and methacrylic acid (available from Mitsubishi Rayon Co., Ltd. as BR-77) was dissolved in 1,000 parts of methyl ethyl ketone, followed by adding 100 parts of pentaerythritol triacrylate to form a first solution.

Next, a photopolymerization initiator containing the components (a), (b), (c), (d) and (e) in the amount shown in Table 2 was dissolved in 300 parts of ethyl alcohol to form a second solution.

The second solution was added to the first solution to form a solution of a photopolymerizable composition.

Preparation of photosensitive resin layer (test panel)

The composition obtained above was coated on an aluminum substrate in a coating amount of 2 g/m$^2$ by using a bar coater and dried at 60° C. for three minutes to obtain a photosensitive layer on the substrate having a thickness of 2.0 μm. An overcoat layer having a thickness of 2.0 μm was formed on the photosensitive layer by coating a 5% solution of polyvinyl alcohol (saponification degree 88%; polymerization degree 500) with a bar coater.

Photosensitivity

The obtained panels were piled with Kodak Step Tablet No.2 (21 steps) followed by exposing for 30 seconds to a light having a wave length of around 630 nm and a light intensity of 2.0 mW/cm$^2$, obtained from a xenone lamp of 150 W (available from Ushio Electric Co. Ltd.) through a Toshiba KL-63 filter. It was then developed with a developing solution containing 10 parts by weight of anhydrous sodium carbonate, 50 parts by weight of ethylene glycol monobutyl either, 3 parts by weight of an anionic surfactant and 1,000 parts by weight of water. The step number which corresponds to the part cured by the minimum exposure energy is expressed as "sensitivity". The result is shown in Table 2.

TABLE 2

| | Photopolymerization initiator | | | | | Sensitivity* |
|---|---|---|---|---|---|---|
| | Component (a) (parts) | Component (b) (parts) | Component (c) (parts) | Component (d) (parts) | Component (e) (parts) | (Step number) |
| Examples | | | | | | |
| 1 | a-1 (6) | (6) | — | — | — | 10 |
| 2 | a-1 (6) | — | (6) | — | — | 8 |
| 3 | a-1 (6) | — | — | (6) | — | 9 |
| 4 | a-1 (6) | — | — | — | (6) | 9 |
| 5 | a-2 (6) | (6) | — | — | — | 12 |
| 6 | a-3 (6) | (6) | — | — | — | 10 |
| 7 | a-1 (6) | (6) | (3) | — | — | 14 |
| 8 | a-1 (6) | (6) | — | (3) | — | 13 |
| Comparative ex. | | | | | | |
| 1 | a-4 (6)** | (6) | — | — | — | 0 |
| 2 | a-4 (6) | — | (6) | — | — | 0 |
| 3 | a-4 (6) | — | — | (6) | — | 0 |
| 4 | a-4 (6) | — | — | — | (6) | 0 |

(b) N-Phenylglycine
(c) Diphenyliodonium chloride
(d) Di-t-butyldiperoxy isophthalate
(e) 2,4,6-Tris(trichloromethyl)-1,3,5-triazine
*The larger the number, the better the sensitivity.
**The sensitizer (a-4) wherein the dimethylamino group a-1 is replaced by a hydrogen atom does not absorb the light of about 630 nm. Accordingly, a cured film resistant to development is not obtained.

What is claimed is:

1. A photopolymerizable composition comprising a polymerizable compound having an ethylenically unsaturated double bond and a photopolymerization initiator wherein the photopolymerization initiator comprises:

(a) a sensitizer represented by the following formula:

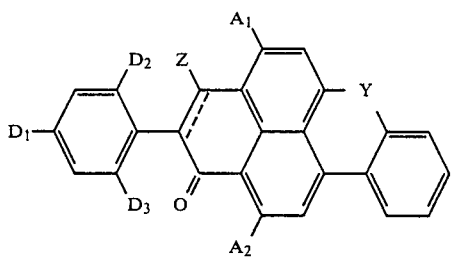

(I)

wherein Y represents an oxygen atom or a sulfur atom, Z represents an oxygen atom, an alkoxy group having 1 to 3 carbon atoms or an alkanoyloxy group having 2 to 4 carbon atoms, provided that when Z is an oxygen atom the bond between said oxygen atom and the carbon atom adjacent thereto is a double bond and the dotted line in the formula (I) is removed, $A_1$ and $A_2$, which are the same or different, are a hydrogen atom or an electron attractive group, $D_1$, $D_2$ and $D_3$, which are the same or different, are a hydrogen atom and an electron donative group, with the proviso that all of $A_1$, $A_2$, $D_1$, $D_2$ and $D_3$ are not simultaneously hydrogen atoms; and (b) a radical forming agent the said polymerizable compound having an ethylenically unsaturated double bond being present in an amount of 1 part by weight, the said sensitizer being present in an amount of 0.001 to 0.2 parts by weight and the said radical forming agent being present in an amount of 0.005 to 0.2 parts by weight.

2. A composition of claim 1 wherein said sensitizer (a) has the following formula;

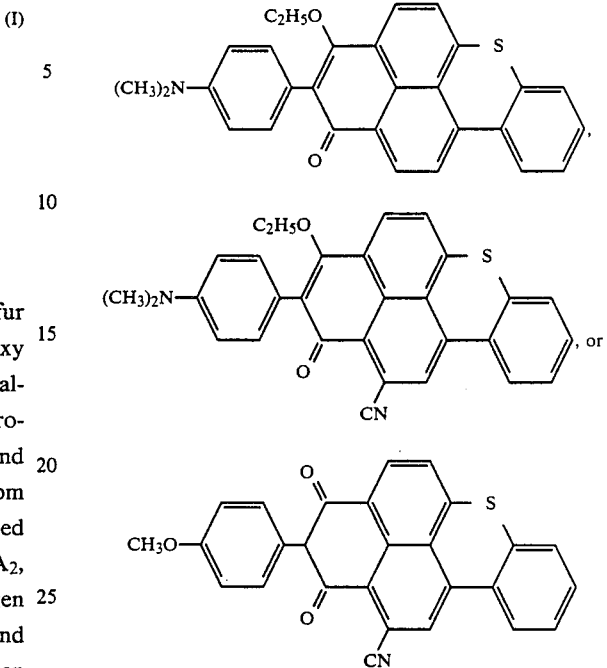

3. A composition of claim 1 wherein said radical forming agent is a compound represented by the following formula:

$R^1$ —X —CH$_2$COOH 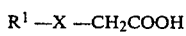

wherein
$R^1$ represents a phenyl group or a substituted phenyl group and X represents an oxygen atom, a sulfur atom or an —NH— group,
a diaryliodonium salt, a peroxyester, an organic halide or a mixture thereog.

4. A composition of claim 1 wherein said polymerizable compound having an ethylenically unsaturated double bond is an acryl ester or a methacryl ester.

* * * * *